United States Patent [19]

Willard

[11] Patent Number: 4,843,441
[45] Date of Patent: Jun. 27, 1989

[54] HIGH FREQUENCY, HIGH POWER FIELD EFFECT TRANSISTOR

[76] Inventor: Jerry W. Willard, Rte. 1, Box 958, Hillsboro, Oreg. 97124

[21] Appl. No.: 83,180

[22] Filed: Aug. 10, 1987

[51] Int. Cl.$^4$ .............................................. H01L 29/80
[52] U.S. Cl. ....................................... 357/22; 357/13; 357/23.8; 357/20
[58] Field of Search ..................... 357/22, 13, 23.8, 20

[56] References Cited

U.S. PATENT DOCUMENTS

| | | | |
|---|---|---|---|
| 3,823,352 | 7/1974 | Pruniaux et al. | 357/22 |
| 4,215,356 | 7/1980 | Kato | 357/22 |
| 4,288,800 | 9/1981 | Yoshida et al. | 357/22 E |
| 4,454,523 | 6/1984 | Hill | 357/22 D |
| 4,670,764 | 6/1987 | Benjamin | 357/20 |
| 4,757,362 | 7/1988 | Biwa et al. | 357/23.4 |

FOREIGN PATENT DOCUMENTS

| | | | |
|---|---|---|---|
| 52-21777 | 2/1977 | Japan | 357/22 |
| 56-83079 | 7/1981 | Japan | 357/22 |
| 61-207081 | 9/1986 | Japan | 357/22 |

Primary Examiner—Andrew J. James
Assistant Examiner—Jerome Jackson, Jr.

[57] ABSTRACT

A high-frequency, low-gate leakage, low-noise, lateral junction field-effect transistor has a short, heavily doped channel of length determined by the dimensions of a backgate within a semiconductor substrate, and a more lightly doped drift region adjacent to the channel. A source region is formed on an end of the channel spaced from the drift region, and a drain region is formed on an end of the drift region spaced from the channel, such that the current flowing between the source and drain regions passes through channel and drift region. A gate electrode of material opposite to the channel forms a rectifying junction with the channel, and an electric field developed in the channel between the gate electrode and the backgate in response to gate and drain potential controls current flow between source and drain. The gate electrode overlays the drift region enough that the depletion region that forms with the application of drain potential moves away from the channel and semiconductor surface.

5 Claims, 6 Drawing Sheets

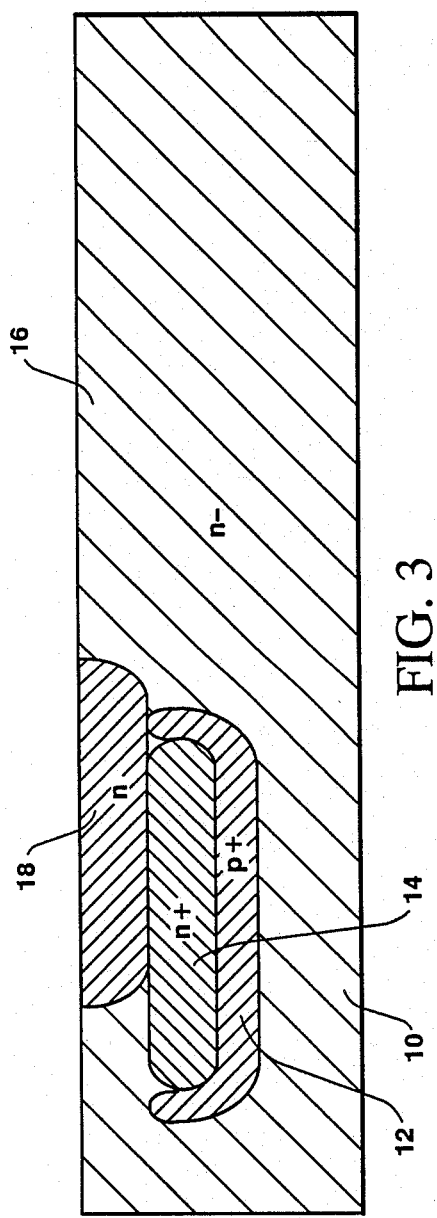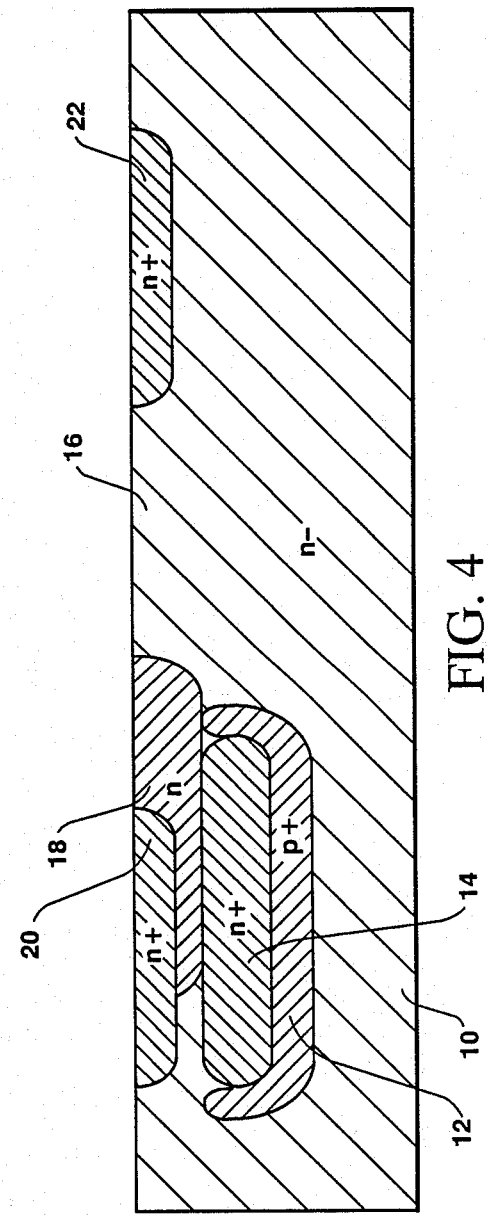

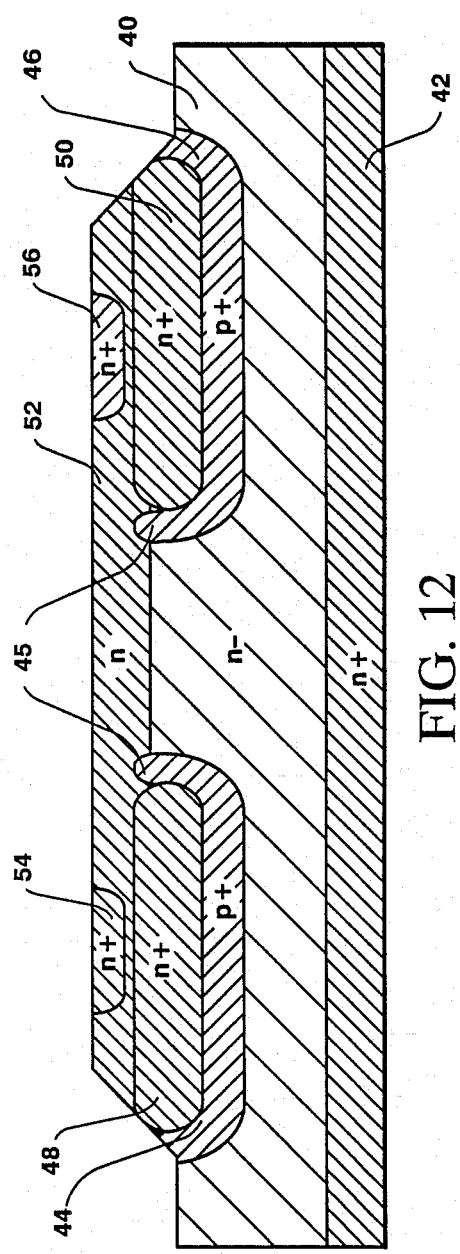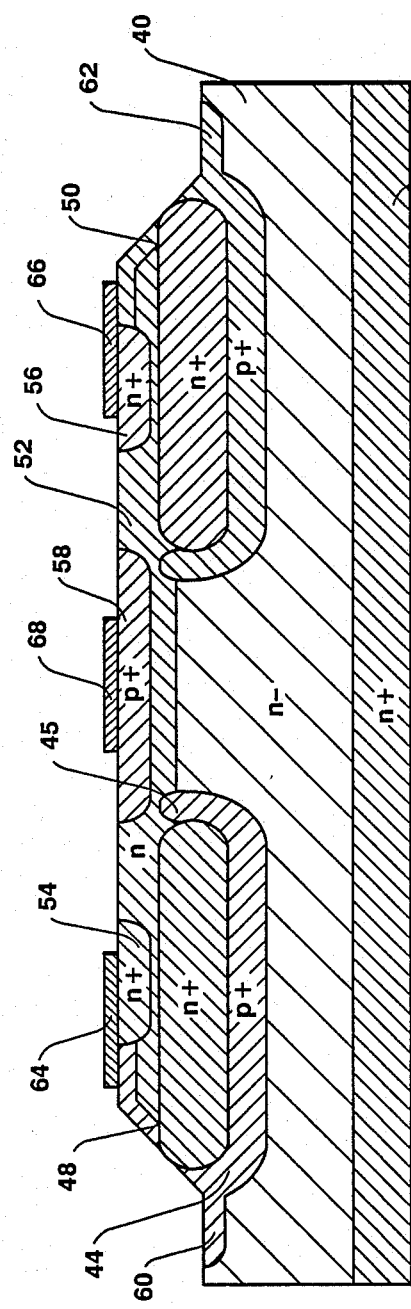

HIGH FREQUENCY, HIGH POWER FIELD EFFECT TRANSISTOR

BACKGROUND OF THE INVENTION

The present invention relates in general to field-effect transistors ("FETs") and in particular to an FET having a drift region adjacent to a channel formed between a gate electrode and a double-diffused back gate.

A junction-field-effect transistor ("JFET") or a metal-semiconductor field-effect transistor (MESFET) comprises a semiconductor channel separating ohmic source and drain regions such that a positive potential between drain and source causes electrons to flow from source to drain. A gate electrode forms a rectifying junction with the channel causing an insulating depletion region to extend from the junction into the channel. In a JFET the gate electrode is semiconductor material and forms a pn junction with the channel, while in a MESFET the gate electrode is metallic and forms a metal-semiconductor junction with the channel. In either case, as the rectifying junction is increasingly reverse biased, or as the drain-to-source voltage increases, the depletion region extends farther into the channel, narrowing the portion of the channel that can support drainsource current and increasing its resistance. Thus the resistance of the channel is a function of both the gate and drain potentials. Channel resistance is also affected by the resistivity of the semiconductor material forming the channel and by the dimensions of the channel, including its "length" in the direction of current flow between the drain and source, its "depth" perpendicular to the direction of current flow and perpendicular to plane of the rectifying junction, and its "width" perpendicular to the direction of current flow and parallel to the plane of the rectifying junction.

The frequency at which a field-effect transistor can operate depends primarily on the mobility of the electrons in the channel material and on the length of the channel. Thus to maximize operating frequency, the channel length should be as short as possible. However, channel lengths in field-effect transistors of the prior art are determined by the dimensions of masks utilized in their fabrication, and dimensional tolerance with which these masks can be fabricated makes it difficult to produce field-effect transistors with very short channel lengths.

Even when field-effect transistors with short channel lengths can be fabricated, the channel length must be larger than the channel depth in order to provide for adequate gate control over current flow. Consequently, as the gate channel length is decreased to permit higher frequency operation, the channel depth must also be decreased. But the reduction in channel depth increases channel resistance at all levels of drain potential and reduces the drain current swing in response to gate potential swing. Since the "power" of a transistor is proportional to the product of the maximum drain voltage swing and maximum drain current swing that it can handle, an increase in channel resistance reduces transistor power.

Channel resistance can be decreased by increasing the doping level within the channel region, but as the doping level increases, the breakdown voltage of the field-effect transistor decreases. The breakdown voltage is the maximum drain voltage that can be tolerated without breakdown of the depletion region, and the breakdown voltage places an upper limit on the drain voltage swing. While increasing doping of the channel increases the drain current swing, thereby tending to increase transistor power, at some point the decrease in breakdown voltage more than offsets the increase in drain current. Thus the power handling capability of a short channel, high frequency field-effect transistor is limited by its low breakdown voltage.

Power handling capability of a short channel field-effect transistor is further limited when high gate input impedance is to be maintained. Field-effect transistors are normally operated in saturation where electrons pass at high velocity through a portion of the channel in which the electric field is high, and some of the high velocity electrons collide with and ionize atoms of the semiconductor material to produce electron-hole pairs. The electrons migrate to the drain, but the holes migrate to the gate, thereby increasing gate "leakage current" and decreasing gate input impedance. The electric field developed in the channel, and therefore the ionization rate, increase with channel doping and drain voltage. While heavy impact ionization produces avalanche breakdown at the breakdown voltage, at lower drain voltages impact ionization can result in an intolerable gate leakage current. Thus, in a high frequency field-effect transistor, the high doping of the channel limits the drain voltage that the field-effect transistor can handle without drawing a large gate current, and therefore places another restriction on the power that the transistor can handle.

The power of a short channel field-effect transistor may also be limited by the "punch-through" phenomena. As the drain voltage increases above pinchoff, the depletion region grows toward the source. When the depletion is near the source, majority carriers in the source region can be injected by thermal activity into the depletion region and then swept by the field therein to the drain. Thus, when the drain voltage is above a "punch-through" voltage, drain current can increase rapidly. For a short channel field-effect transistor, the punch-through voltage is typically below the breakdown voltage and therefore in a short channel field-effect transistor, the punch-through voltage has a more limiting effect on the field-effect transistor's power handling capability than the breakdown voltage.

SUMMARY OF THE INVENTION

In accordance with one aspect of the invention, a high-frequency, high-power field-effect transistor comprises a short, heavily doped, channel region and an adjacent, more lightly doped "drift" region of the same conductivity type (p or n). A source region is formed on an end of the channel region, spaced from the drift region, and a drain region is formed on an end of the drift region, spaced from the channel region. A gate electrode forms a rectifying junction with the channel thereby producing a depletion region within the channel, the depletion region having dimensions controlled by the potentials of the gate and drain with respect to the source. At various levels of gate potential, a positive potential between drain and source causes carriers to flow from the source region, through the channel region, through the drift region, and then into the drain region.

The short channel permits the field-effect transistor to operate at high frequency, and the drift region permits the field-effect transistor to operate at high power. As the drain potential increases, the depletion region tends to grow into the more lightly doped drift region, toward the drain, rather than into the more heavily doped channel, toward the source. Therefore the punch-through voltage remains high and does not limit the power of the field-effect transistor. In addition, the rapid growth of the depletion region into the drift region, rather than into the channel, prevents a large electric field from developing in the channel. Thus electrons in the channel do not reach high velocities that can result in substantial impact ionization. Since avalanche breakdown in the depletion region and gate leakage are caused by impact ionization, the drift region increases the breakdown voltage and minimizes gate leakage current due to impact ionization.

In accordance with another aspect of the invention, the channel length is determined by the diffusion depths of a double-diffused backgate. Inasmuch as diffusion depths can be controlled more accurately than mask dimensions, the channel length is controlled more accurately than in field-effect transistors of the prior art in which channel length is determined by mask dimensions.

It is accordingly an object of the invention to provide a high-frequency, high power transistor having low gate current leakage.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIGS. 1-5 are sectional views of a lateral junction field-effect transistor in accordance with the present invention following successive stages of construction;

FIGS. 9-13 are sectional views of a vertical junction field-effect transistor in accordance with the present invention following successive stages of construction.

DETAILED DESCRIPTION

Figure 1:
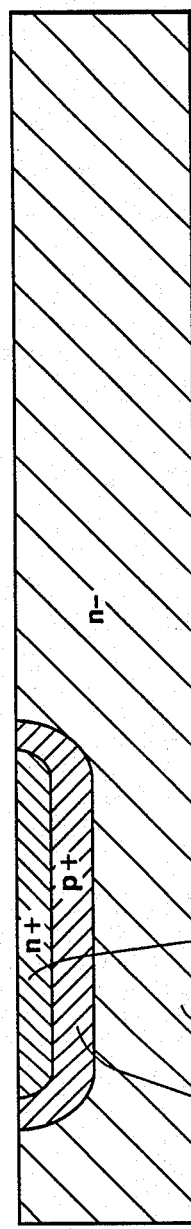
Figure 2:
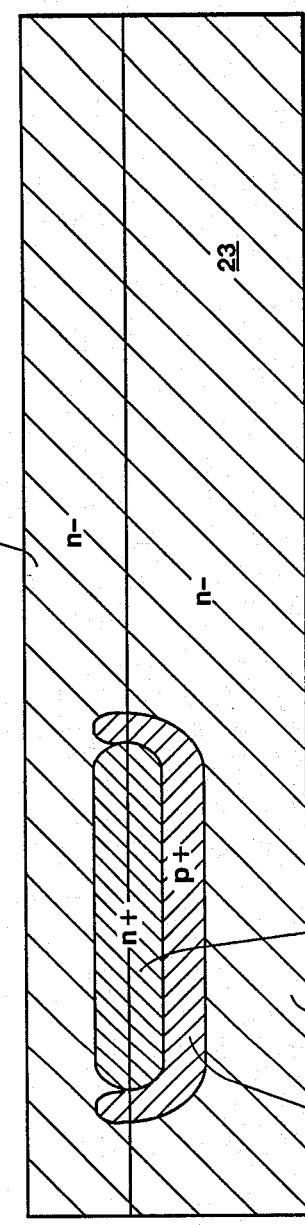
Figure 5:
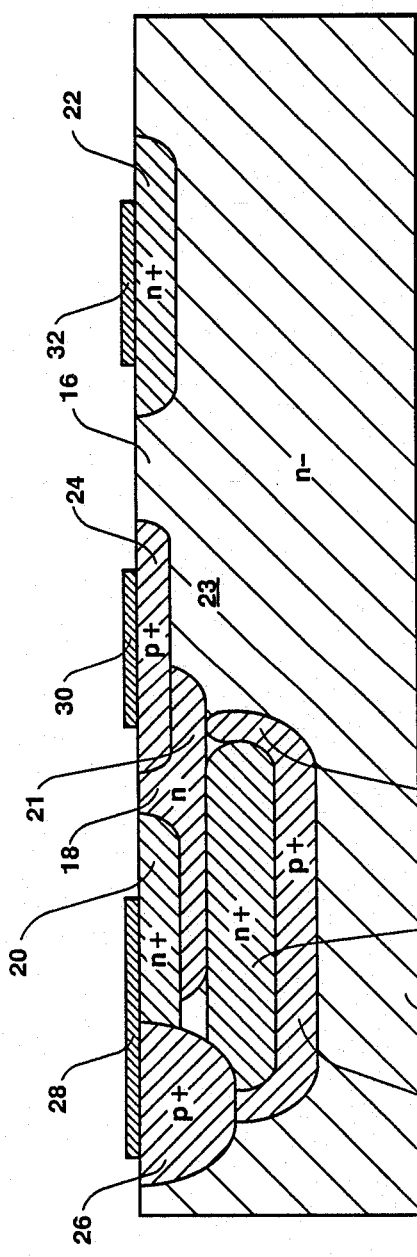
Figure 9:
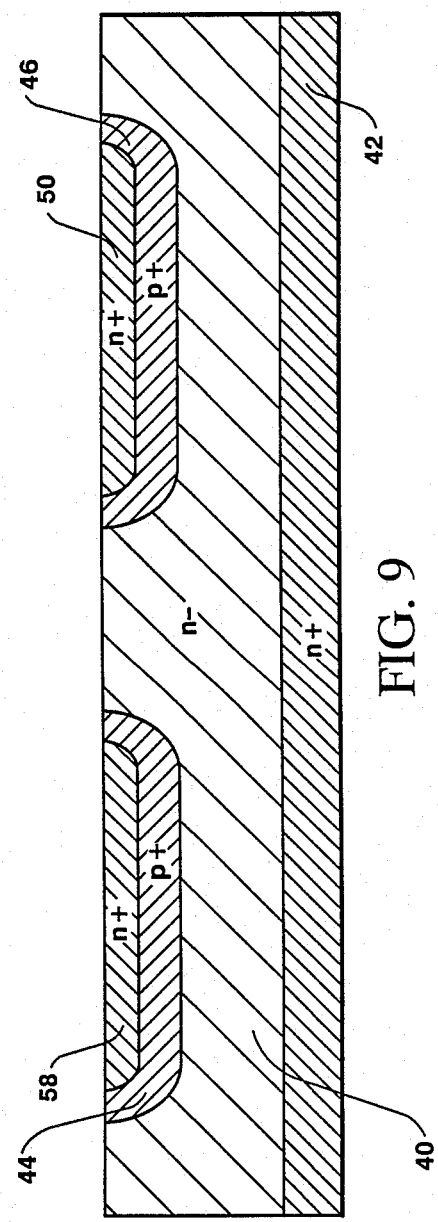

With reference to FIGS. 1-5, a lateral junction field effect transistor (JFET) is constructed in accordance with the present invention starting with an n-type semiconductor substrate 10 (such as silicon, gallium arsenide, etc.) into which p-type dopants are diffused to form a p+ region 12. Thereafter, n-type dopants are diffused into the p+ region 12 (through the same mask used to form region 12), thereby forming an n+ region 14 therein (FIG. 1). An n- epitaxial layer 16 is deposited on substrate 10 covering regions 12 and 14, and the p+ and n+ dopants of regions 12 and 14 diffuse into the epitaxial layer 16 (FIG. 2). Then n-type material is diffused into the epitaxial layer 16 to form an n region 18 of less resistivity than layer 16 (FIG. 3). A pair of n+ regions 20 and 22 are diffused into the epitaxial layer 16, with region 20 extending partly into region 18 (FIG. 4). Thereafter, as illustrated in FIG. 5, a p+ region 24 and a p+ backgate contact region 26 are diffused into the epitaxial layer 16. Region 24 is situated between regions 18 and 22 and extends partly into region 18 to align over region 15. Metallic contacts 28, 30 and 32 are then deposited on top of regions 20, 42, and 32, respectively, with contact 28 extending over region 26.

FIG. 5 shows the completed JFET having region 20 as its source, region 22 as its drain and region 24 as its gate. Regions 12 and 14 define a backgate 15, which is tied to source 20 via backgate contact region 26 and contact 28, and a portion of region 18 forms a channel 21 between backgate 15 and gate 24. When silicon is employed as substrate 10, the doping of substrate 10 and epitaxial layer 16 are suitably adjusted for a resistivity of 4.0 Ohm-cm, and the doping of the n-channel diffusion region 18 is suitably adjusted for resistivity of 0.25 Ohm-cm. The channel depth (i.e., its vertical dimension in FIG. 5) is determined by the diffusion depth of gate region 24, and the channel length (i.e., its horizontal dimension in FIG. 5) is determined by a combination of the diffusion depths of regions 12 and 14. Inasmuch as diffusion depths can be accurately controlled, the channel length and depth may be adjusted for relatively short dimensions. In a silicon-based JFET, the length of channel 21 is suitably on the order of 1 micron and the depth of the channel is suitably about 0.7 micron. The drift region is suitably about 8 microns long. (It should be understood that relative dimensions in FIGS. 1-5 have been exaggerated for illustrative purposes.)

Thus FIG. 5 shows an n-channel JFET comprising a relatively heavily doped, short n-channel 21 and an adjacent, more lightly doped n-type "drift" region 23. The source region 20 is formed on an end of the channel 21 spaced from the drift region 23, and the drain region 22 is formed on an end of the drift region 23 spaced from the channel 21. The p+ gate region 24 forms a pn junction with the channel region 21, thereby producing a depletion region within the channel having dimensions controlled by the potentials of the gate region 30 and drain region 22 with respect to the source region 20. At various levels of gate potential, a positive potential between drain and source regions 22 and 20 causes electrons to flow from the source region, through the channel 21, through the drift region 23, and then into the drain region 22.

Figure 6:
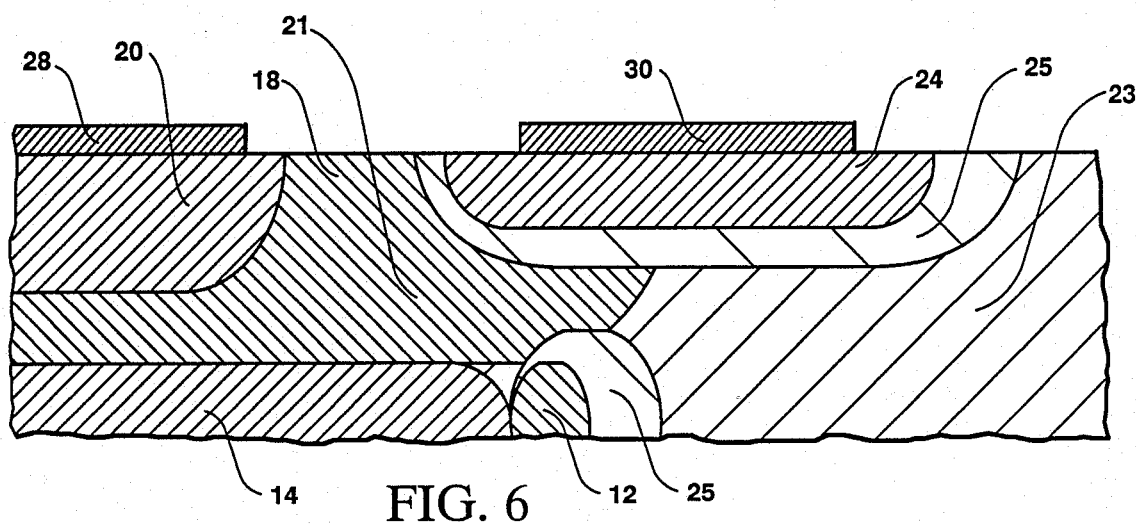
FIG. 6-8 are expanded sectional views of a portion of the junction field-effect transistor of FIG. 5.
Figure 7:
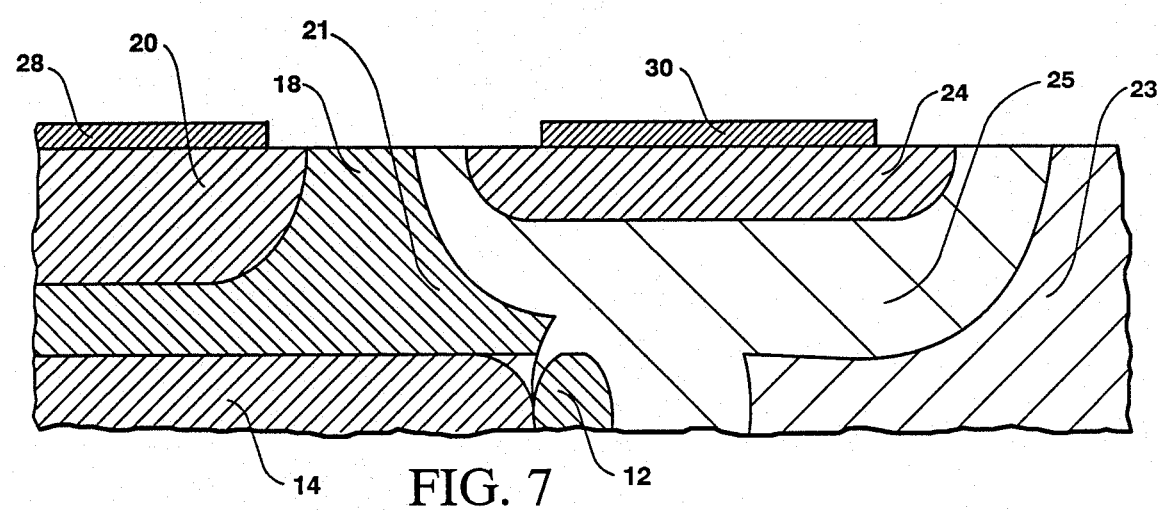
Figure 8:
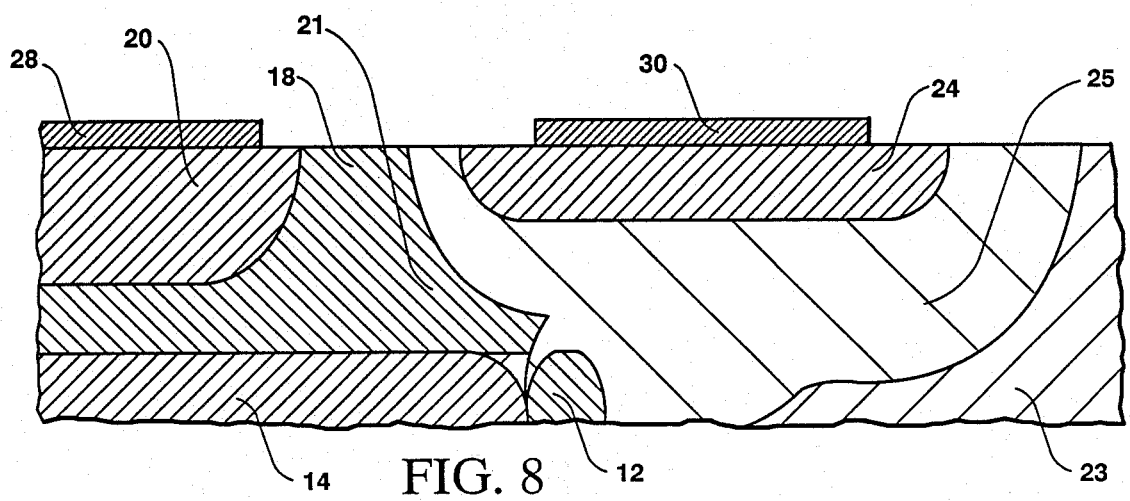

FIGS. 6-8 show an expanded sectional view of region 18 and its bordering regions as the potential of drain region 22 increases from pinchoff voltage in FIG. 6 to a relatively higher value in FIG. 8. A the drain potential increases, the depletion region 25 tends to grow into the more lightly doped drift region 23, toward the drain rather than towards the source region 20. The distance between the source region 20 and the depletion region 25 tends to remain relatively constant with increasing drain voltage, and therefore the punch-through voltage remains high and does not limit the power of the JFET. In addition, the thickness of the depletion region 25 grows rapidly as drain voltage increases, preventing buildup of large electric fields in the depletion region which can accelerate electrons to high velocities and cause substantial impact ionization. Since the drift region minimizes impact ionization at all levels of drain voltage, it reduces gate leakage current and increases the breakdown voltage of the JFET. A silicon-based JFET having a channel length and depth of about 1 and 0.7 micron respectively, an 8 micron wide drift region, 0.25 Ohm-cm channel resistivity, and 4.0 Ohm-cm drift region resistivity, is capable of handling approximately 100 volt peak drain-source potentials at operating frequencies on the order of 2 GHz.

Figure 10:
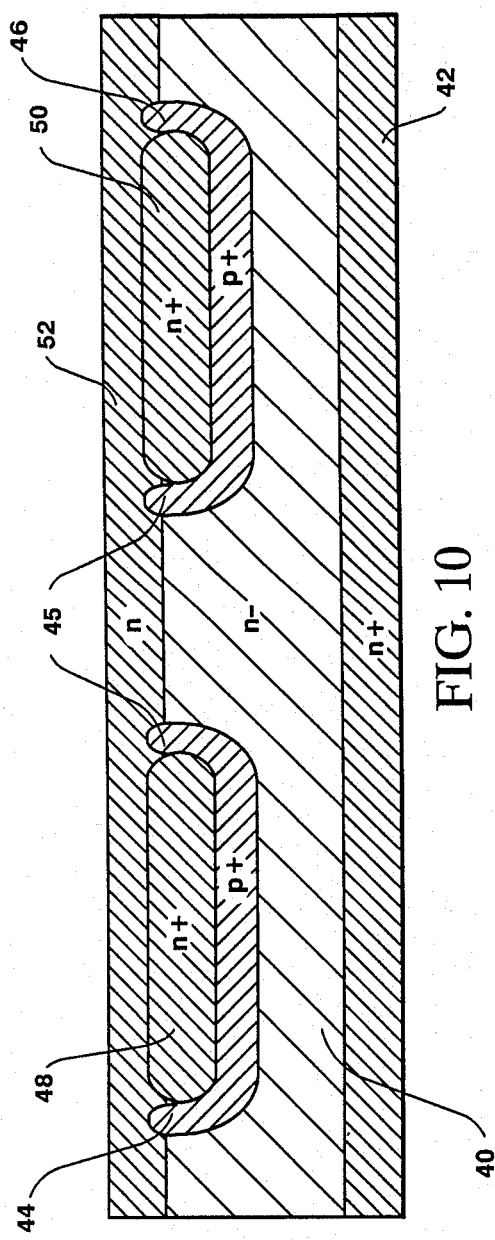
Figure 11:
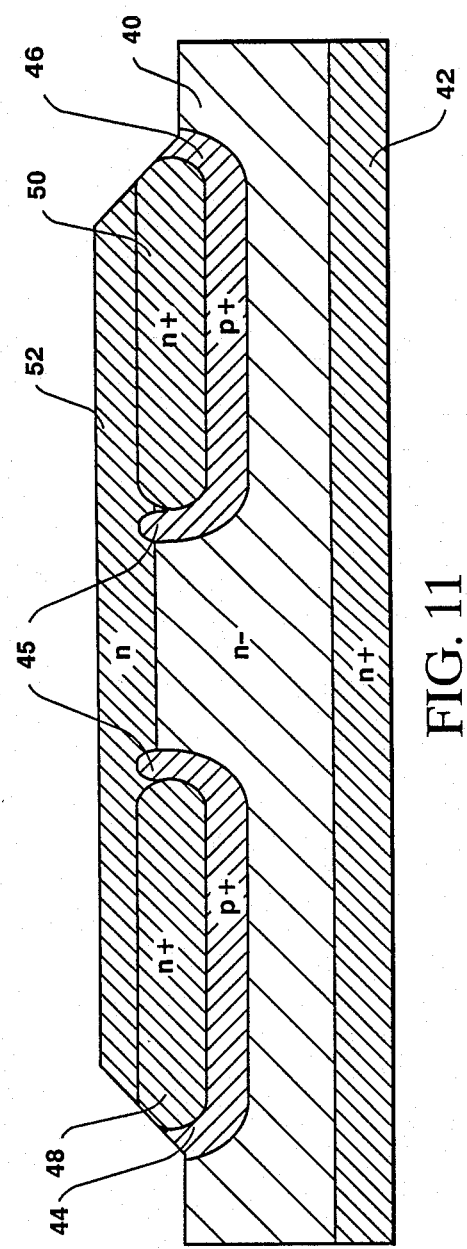

With reference to FIGS. 9-13 a vertical junction field effect transistor in accordance with the present invention is constructed starting with a heavily doped (n+) substrate 42 (the drain region) upon which a lightly doped (n+) epitaxial layer 40 is deposited. A pair of p+ regions 44 and 46 are diffused into epitaxial layer 40, and using the same mask, a pair of n+ regions 48 and 50 are diffused into the p+ regions 44 and 46, respectively (FIG. 9), thereby forming a backgate 45. An n-type epitaxial region 52 is then deposited on layer 40 covering regions 44-50 which subsequently diffuse into layer 52 (FIG. 10). Portions of layers 40 and 52, along with portions of regions 44-50, are removed by anisotropic etching (FIG. 11), and a pair of n+ source regions 54 and 56 are diffused into layer 52 (FIG. 12). Backgate contact p+ regions 60, 62 and a gate region 58 are diffused into the structure, the backgate contact regions extending into regions 44 and 46 and contacting source regions 54 and 56. Gate region 58 extends into layer 52 above backgate 45. Metallic contacts layers 64, 66 and 68 are deposited on top of source regions 54 and 56 and gate region 68, respectively, with contacts 64 and 66 extending over backgate contact regions 60 and 62, respectively. The backgate contact regions 60 and 62, n+ regions 48 and 50, backgates 44 and 46 and source regions 54 and 56 may form rectangular or circular rings when viewed from above. The ring formed by backgate contact regions 60 and 62 acts as a voltage field terminating ring around the transistor's periphery for enhanced high-voltage operation.

The channel region of the transistor of FIG. 13 is formed between the gate region 58 and backgate 45. The length of the channel is determined by the relative diffusion depths of backgate regions 44 and 46 with respect to the n+ regions 48 and 50, rather than by mask dimensions, and therefore may be accurately controlled to a small value. The channel depth is controlled by the diffusion depth of gate 58 and the thickness of layer 52, and is therefore also accurately controllable. The n-epitaxial region 40 of FIG. 13 forms a lightly doped drift region into which the depletion region surrounding the pn junction between gate region 58 and channel region 52 grows as the drain voltage increases. The drift region in the vertical JFET of FIG. 13 provides the same benefit as the drift region of the lateral JFET of FIG. 5 in terms of limiting growth of the depletion region into the channel as the drain potential increases, thereby preventing build-up of high electric fields in the channel which can cause increased gate leakage current or avalanche breakdown due to impact ionization. In a silicon-based vertical JFET, the channel length and depth are suitably 1.0 and 0.07 microns, respectively, the drift region is suitably 8 microns deep, and channel and drift region 40 resistivities are suitably 0.25 and 4.0, respectively. This combination produces a JFET capable of operating at 2 GHz while handling 100V drain potentials.

Thus, in accordance with the present invention, a high-frequency, high-power JFET comprises a heavily doped, channel region and an adjacent, more lightly doped drift region. A heavily doped source region abuts the channel region spaced from the drift region, a gate region abuts a portion of the channel region between the source and drift regions, and a drain region, spaced from the channel region, abuts the drift region. The lightly doped drift region between the drain and channel regions absorbs much of the depletion region developed around the pn junction formed between the gate and channel as the drain potential increases, thereby minimizing punch-through and gate leakage current and maximizing breakdown voltage.

Although the preferred embodiment of the present invention is an n-channel JFET, the invention may be implemented as a p-channel JFET by reversing the conductivity types (p and n) of the semiconductor regions in FIGS. 5 and 13. The present invention may also be implemented as a metal-semiconductor field-effect transistor (MESFET). A MESFET is similar to a JFET but the gate in a MESFET is a metal, rather then a semiconductor, and forms a metal-semiconductor rectifying contact with the channel rather than a pn junction. Nonetheless, a depletion region forms in the MESFET channel as a result of the metal-semiconductor junction and changes in size and shape in accordance with the gate and drain voltages so as to control drain current in much the same way that it is controlled in a JFET. The lateral JFET of FIG. 5 can be converted to a MESFET by eliminating the p+gate diffusion 24. The metallic contact 30 then forms a metal-semiconductor junction with channel 18. In such case, the width of the channel 18 is still controlled by the relative diffusion depths of regions 12 and 14 but the depth of the channel is controlled by the thickness of layer 16. Similarly the vertical JFET of FIG. 13 can be converted to a MESFET by eliminating the gate diffusion 58 such that metal contact 68 forms a rectifying junction with region 52.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A lateral field-effect transistor comprising:
   a doped semiconductor channel formed in a semiconductor substrate;
   a doped semiconductor drift region formed in said semiconductor substrate, laterally adjacent to the channel and less heavily doped than said channel;
   a doped semiconductor source formed near a surface of one side of said semiconductor substrate, laterally spaced from the drift region and contacting the channel;
   a doped semiconductor drain formed near said surface of said semiconductor substrate, contacting the drift region and laterally spaced from the channel, said channel and said drift region providing a conductive path for current flowing laterally between said source and said drain; and
   a conductive gate formed near said surface of said semiconductor substrate, laterally spaced from said source and drain, contacting said channel and drift region and forming a rectifying junction therewith.

2. A field-effect transistor comprising:
   a doped semiconductor channel;
   a doped semiconductor drift region laterally adjacent to the channel and less heavily doped than said channel;
   a doped semiconductor source contacting the channel and spaced from the drift region;
   a doped semiconductor drain contacting the drift region and spaced from the channel, said channel and said drift region providing a conductive path for current flowing laterally between said source an said drain; and a conductive gate electrode contacting said channel and drift region forming a rectifying junction therewith, wherein said channel is formed in a semiconductor substrate and has a dimension in a direction of current flow in said channel between said drain and source determined by at least one diffusion within said semiconductor substrate.

3. A lateral field-effect transistor comprising:

a channel comprising semiconductor material of first conductivity type and of first resistivity;

a drift region comprising semiconductor material of said first conductivity type abutting said channel and having resistivity greater than said first resistivity;

a source comprising semiconductor material of said first conductivity type spaced from said drift region, and abutting said channel;

a drain comprising semiconductor material of said first conductivity type spaced from said channel and abutting said drift region and separated from said channel by said drift region; and a gate comprising semiconductor material of a second conductivity type, laterally spaced from said source and drain, abutting said channel and drift region and forming a rectifying contact therewith, the drain, source, gate and drift region being formed near the surface of one side of a semiconductor substrate.

4. The transistor in accordance with claim 3 further comprising a backgate comprising material of a second conductivity type abutting said channel, said gate and backgate being spaced one from another and positioned with respect to said source and drain regions such that current flowing in said channel between said source and drain passes between said gate and backgate, and wherein said channel has a dimension in a direction of current flow in said channel between said drain and source determined by a dimension of said backgate.

5. The transistor in accordance with claim 4 wherein the backgate has a dimension in the direction of current flow smaller than said channel, positioned with respect to said channel such that the edge of said backgate facing the drain is aligned near, but not beyond, the end of said channel.

* * * * *